US008026757B2

(12) United States Patent
Bedeschi et al.

(10) Patent No.: US 8,026,757 B2
(45) Date of Patent: Sep. 27, 2011

(54) CURRENT MIRROR CIRCUIT, IN PARTICULAR FOR A NON-VOLATILE MEMORY DEVICE

(75) Inventors: Ferdinando Bedeschi, Monza (IT); Claudio Resta, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 12/570,770

(22) Filed: Sep. 30, 2009

(65) Prior Publication Data

US 2010/0141335 A1 Jun. 10, 2010

(30) Foreign Application Priority Data

Sep. 30, 2008 (IT) .............................. TO2008A0716

(51) Int. Cl.
*G11C 11/4074* (2006.01)
*H03K 17/687* (2006.01)
*G05F 3/26* (2006.01)

(52) U.S. Cl. ........ 327/543; 327/544; 327/546; 323/315; 365/229

(58) Field of Classification Search ........................ None
See application file for complete search history.

(56) References Cited

U.S. PATENT DOCUMENTS

| | | | | |
|---|---|---|---|---|
| 5,444,363 | A * | 8/1995 | Cabler | 323/315 |
| 6,404,275 | B1 * | 6/2002 | Voldman et al. | 327/538 |
| 6,456,553 | B1 * | 9/2002 | Brass et al. | 365/222 |
| 7,292,466 | B2 * | 11/2007 | Nirschl | 365/148 |
| 7,436,693 | B2 * | 10/2008 | Kang et al. | 365/148 |
| 7,535,783 | B2 * | 5/2009 | DeBrosse et al. | 365/208 |
| 7,777,469 | B2 * | 8/2010 | Nguyen | 323/282 |
| 2004/0239654 | A1 * | 12/2004 | Okuda | 345/204 |
| 2005/0264344 | A1 | 12/2005 | Kim et al. | |
| 2007/0285153 | A1 * | 12/2007 | Hasegawa | 327/543 |
| 2008/0100382 | A1 | 5/2008 | Fisher et al. | |

FOREIGN PATENT DOCUMENTS

| | | | |
|---|---|---|---|
| EP | 1 132 882 | A2 | 9/2001 |
| JP | 05-283945 | A | 10/1993 |

* cited by examiner

*Primary Examiner* — Lincoln Donovan
*Assistant Examiner* — Terry L Englund
(74) *Attorney, Agent, or Firm* — Lisa K. Jorgenson; William J. Pigott; Seed IP Law Group PLLC

(57) ABSTRACT

A current mirror circuit is provided with a first current mirror including first and second mirror transistors sharing a common control terminal; the first mirror transistor has a conduction terminal for receiving, during a first operating condition, a first reference current, and the second mirror transistor has a respective conduction terminal for providing, during the first operating condition, a mirrored current based on the first reference current. The current mirror circuit is provided with a switching stage operable to connect the control terminal to the conduction terminal of the first mirror transistor during the first operating condition, and to disconnect the control terminal from the same conduction terminal of the first mirror transistor, and either letting it substantially float or connecting it to a reference voltage, during a second operating condition, in particular a condition of stand-by.

16 Claims, 3 Drawing Sheets

CURRENT MIRROR CIRCUIT, IN PARTICULAR FOR A NON-VOLATILE MEMORY DEVICE

BACKGROUND

1. Technical Field

The present disclosure relates to a current mirror circuit. The disclosure will make reference to the field of non-volatile memory devices, in particular PCM (Phase Change Memory) devices, without this implying any loss in generality.

2. Description of the Related Art

As is known, PCM devices include an array of memory cells connected at the intersections of bitlines and wordlines and comprising each a memory element. The memory element comprises a phase change region made of a phase change material, i.e., a material that may be electrically switched between a generally amorphous and a generally crystalline state across the entire spectrum ranging between a completely amorphous and a completely crystalline state; as phase change materials, various chalcogenide elements are commonly used. The state of the phase change material is non-volatile, absent application of excess temperatures, such as those in excess of 150° C., for extended times. When the memory is set in either a crystalline, semi-crystalline, amorphous, or semi-amorphous state representing a resistance value, that value is retained until reprogrammed, even if power is removed. Phase changes are obtained by locally increasing the temperature of the memory element by means of resistive electrodes (generally known as heaters) in contact with the chalcogenide element.

Current mirror circuits are widely used in such non-volatile memory devices, in particular in sense amplifiers stages thereof, and allow to perform memory operations on the individual memory cells, like reading or verify during programming (either during writing or erasing).

FIG. 1 shows a schematic block diagram of a portion of a known non-volatile memory device (e.g., a PCM memory device), denoted in general with 1, made in a die 2 (shown schematically) of a semiconductor material.

A reference current $I_{ref}$ is generated in a periphery portion 2*a* of the die 2 by means of a reference current generator 3 and routed towards a core portion 2*b* of the same die 2, in which memory partitions Pi of the memory device 1 are made, via a reference current bus. Each memory partition Pi includes a respective current mirror 4, that is connectable to the reference current bus via a respective connecting switch 5. Each current mirror 4 has a reference branch (including a first, diode-connected, MOS transistor 6) connectable to the reference current bus via the respective connecting switch 5 and receiving therefrom the reference current $I_{ref}$, and a plurality of mirrored branches (including respective second MOS transistors 7) connected to respective sense amplifier stages (here not shown in detail and denoted with reference SA), the number of the sense amplifier stages SA being dependent on the number of memory cells making up each memory partition Pi. Current mirrors 4 allows the local generation of replicas of the reference current $I_{ref}$ at each memory partition Pi, to be supplied to the sense amplifier stages SA for performing memory operations.

Routing of current reference $I_{ref}$, instead of a voltage reference, is advantageous to avoid ohmic losses occurring along the reference current bus (and consequent variations in the reference quantity supplied to the various memory partitions Pi), but entails higher power consumption. In particular, generation of reference currents having lower values (to reduce the above power consumption) is not practical, because disturbance factors, such as parasitic capacitance or charge injection due to switching of the transistors, must be taken into account, and the locally generated replicas of the reference currents should have mismatch errors preferably lower than 5%; as a consequence, high polarization reference currents are indeed needed in such current mirror circuits.

In particular, power consumption should be reduced as much as possible when a memory partition Pi is deselected or put in stand-by (i.e., in any condition in which the memory cells of the partition are not involved in memory operations). Moreover, the time for exiting from the stand-by (or deselected) condition should be as low as possible, in order for the same memory cells to be readily available for next memory operations. This implies that start-up of the current mirrors should be enhanced, in order to reduce re-activation delays.

Current-mirror circuit arrangements have already been proposed to achieve efficient stand-by management, for example including dedicated start-up circuits facilitating transition from a stand-by to an operating state. However, these circuits have not proven to be fully satisfactory, in particular as far as the requirements of low power-consumption or low mismatches are concerned.

BRIEF SUMMARY

One embodiment is a current mirror circuit that allows to overcome one or more of the above drawbacks, and in particular that allows to achieve a low power consumption and an efficient management of a stand-by (or deselected) condition.

BRIEF DESCRIPTION OF THE SEVERAL VIEWS OF THE DRAWINGS

For the understanding of the present disclosure, preferred embodiments thereof are now described, purely by way of non-limiting examples, with reference to the enclosed drawings, wherein.

DETAILED DESCRIPTION

Figure 1:
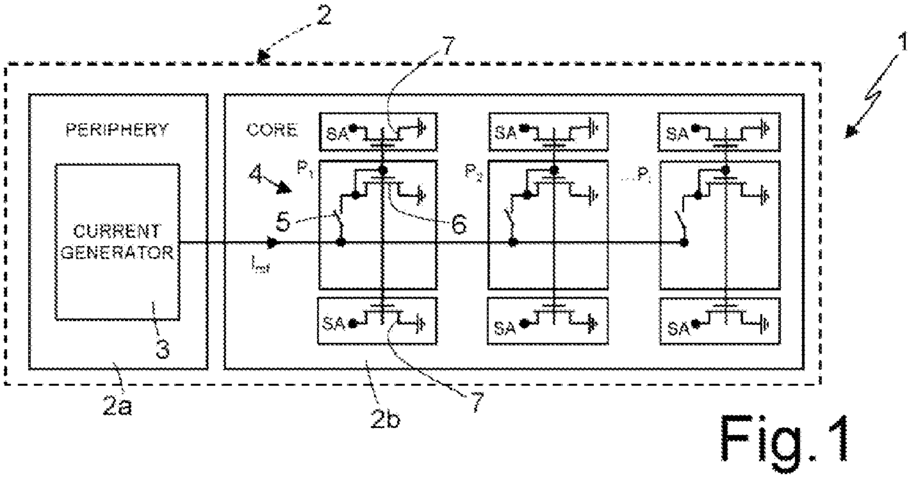
Fig. 1 (Prior Art)
FIG. 1 shows a schematic block diagram of a portion of a known non-volatile memory device.
Figure 2:
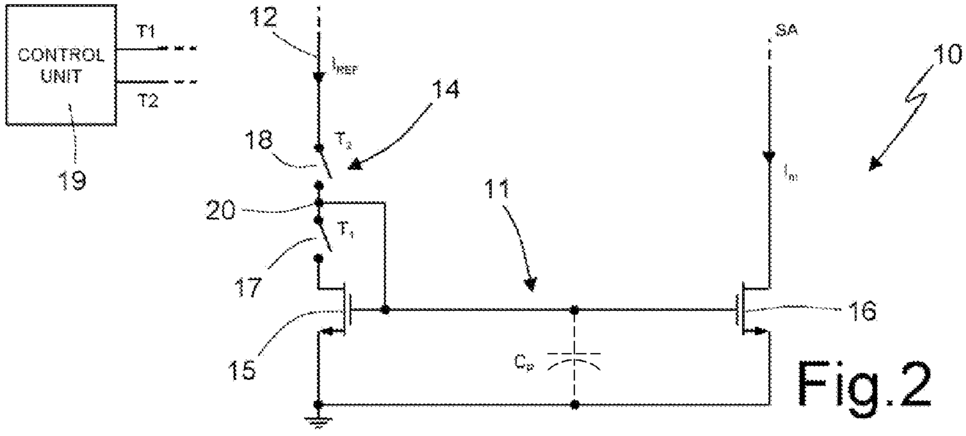
FIG. 2 shows a current mirror circuit according to a first embodiment of the present disclosure.

FIG. 2 shows a current mirror circuit 10 according to a first embodiment of the present disclosure; the current mirror circuit 10 may be part of a non-volatile memory device (e.g., as shown in FIG. 1), and supply a mirrored current $I_m$ to a sense amplifier stage SA thereof.

In detail, the current mirror circuit 10 comprises: a first current mirror 11, operable to mirror a first reference current $I_{ref}$ received from a first reference current bus 12, for generating a local replica thereof (mirrored current $I_m$); and a switching stage 14, which, as will be explained in detail, is operable to achieve reduction of power consumption and delays due to re-activation from stand-by (or any non-operating condition) in the current mirror circuit 10.

The first current mirror 11 includes a first mirror transistor 15 (in particular an n-type MOS), and a second mirror transistor 16 (also an n-type NMOS), operatively coupled to the first mirror transistor 15 for generation of the mirrored current $I_m$. The switching stage 14 comprises first and second switches 17, 18, receiving respectively first and second control signal T1, T2 controlling switching thereof. The control signals T1, T2 are generated by a control unit 19 (shown schematically in FIG. 2), operatively coupled to the current mirror circuit 10 (e.g., the control unit 19 may also manage general operation of the non-volatile memory device incorporating the current mirror circuit 10).

In greater detail, the first mirror transistor 15 has a first conduction terminal (e.g., the source terminal) connected to a reference potential (e.g., ground), a second conduction terminal (e.g., the drain terminal) connected to an intermediate node 20 of the current mirror circuit 10 via the first switch 17, and a control terminal (i.e., the gate terminal) connected to the intermediate node 20 (closing of the first switch 17 thus determining the “diode” connection of the first mirror transistor 15, used for mirroring operation). The second mirror transistor 16 has a respective first conduction (or source) terminal connected to the reference potential, a respective second conduction (or drain) terminal connected to a corresponding sense amplifier stage SA (not shown), and a respective control (or gate) terminal directly connected to the control terminal of the first mirror transistor 15.

The second switch 18 of the switching stage 14 is set between the intermediate node 20 and the first reference current bus 12, and is operable to connect the first current mirror 11 to the same reference current bus (thus operating as a selection switch selecting for operation the current mirror circuit 10, and the associated sense amplifier stage SA).

During an active state of the current mirror circuit 10, when the same current mirror circuit is selected for performing reading or verify memory operations, the control signals T1 and T2 control closing of both the first and the second switches 17, 18, so that the first current mirror 11 receives the first reference current $I_{ref}$, and provides to the associated sense amplifier stage SA the mirrored current $I_m$.

On the contrary, during a stand-by state of the current mirror circuit 10, when the same current mirror circuit is not selected for performing memory operations, the control signals T1 and T2 control opening of both the first and second switches 17, 18, so that the control terminal of the first mirror transistor 15 is substantially left floating. No power consumption due to the reference current $I_{ref}$ should thus be generated in this operating condition. Moreover, the voltage of the same control terminal should remain set to the value it reached during the previous (active) state; in particular, a parasitic capacitance at the control terminal, shown schematically and denoted with $C_p$ in FIG. 2, should remain charged to the value previously reached. Accordingly, when the current mirror circuit 10 subsequently passes from the stand-by to the active state (by newly closing of the first and second switches 17, 18), the control terminal will already be at, or near to, a voltage value that starts mirroring of the first reference current $I_{ref}$, thus greatly reducing re-activation delays (this voltage value corresponding, in a known manner, to a threshold plus a suitable overdrive voltage for the first mirror transistor 15).

The above circuit can thus be used advantageously to manage relatively short stand-by periods; in case of longer stand-by periods, the parasitic capacitance $C_p$ may get discharged due to leakage currents across the first and second switches 17, 18 and off-currents flowing through the first and second mirror transistors 15, 16, so that the voltage value of the control terminal may not be predictable at the end of the stand-by period.

Figure 3:
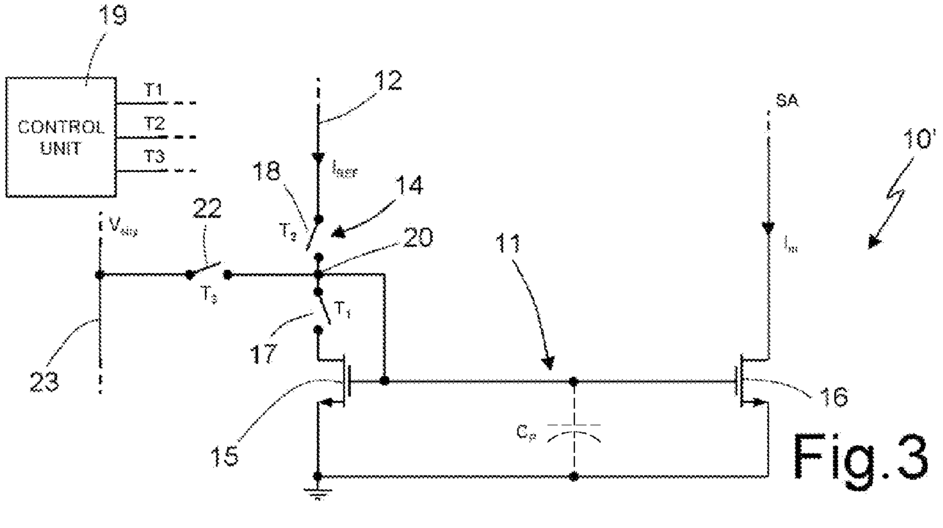
FIG. 3 shows a current mirror circuit according to a second embodiment of the present disclosure.

Therefore, in a current mirror circuit 10' according to a second embodiment of the present disclosure, FIG. 3, the switching stage 14 comprises a third switch 22, that is operable to connect the intermediate node 20 to a reference voltage line 23 at a stand-by voltage $V_{sby}$; in particular, the third switch 22 receives a third control signal T3 from the control unit 19.

During an active state of this current mirror circuit 10', the first and second control signals T1 and T2 control closing of both the first and the second switches 17, 18, while the third control signal T3 controls opening of the third switch 22, so that again the first current mirror 11 receives the first reference current $I_{ref}$, and provides to the associated sense amplifier stage SA the mirrored current $I_m$.

During a stand-by state of the current mirror circuit 10', the control signals T1 and T2 cause opening of both the first and the second switches 17, 18, while the third control signal T3 controls closing of the third switch 22, so that the control terminal of the first mirror transistor 15 is connected to the reference voltage line 23 and kept at the stand-by voltage $V_{sby}$. In this condition, the parasitic capacitance $C_p$ charges, and is kept charged, to the value of the stand-by voltage $V_{sby}$; if a proper value for this stand-by voltage $V_{sby}$ is chosen, the voltage value of the control terminal undergoes minimum variations (in the order of mV, preferably less than 5 mV) with respect to the value in the active state, so that, at the passage from the stand-by to the active state, the control terminal is indeed at the value that starts proper mirroring of the first reference current $I_{ref}$, without an appreciable delay.

The value for the stand-by voltage $V_{sby}$ thus depends on the (physical and electrical) characteristic of the electrical components used in the current mirror circuit 10', and in particular of the first and second mirror transistors 15, 16; in any case, this value is such as to allow substantially immediate generation (with delays in the order of ns), by the same mirror transistors, of the mirrored current $I_m$ from the reference current $I_{ref}$, once returning into the active condition. In other words, this value is as close as possible (preferably substantially equal) to the voltage value at the control terminal that establishes current flow through the channel of both the first and second mirror transistors 15, 16 (i.e., to the sum of the threshold plus a suitable overdrive voltage for the first mirror transistor 15). An acceptable deviation of the stand-by voltage $V_{sby}$, with respect to the above voltage value required at the control terminal could be in the order of 1%, preferably between 0.5% and 1%.

According to an aspect of the present disclosure, the stand-by voltage $V_{sby}$ is equal to, or is generated starting from, a band-gap voltage reference $V_{bg}$, that is normally present, and used as reference, in a non-volatile memory chip. As is known, bandgap voltage references are used to create a very stable reference voltage with respect to both temperature and power supply variations, and so are particularly useful in this context. In this case, first current mirror 11 may be designed and sized, so that the voltage at the control terminal required for its overdrive is as close as possible to the band-gap voltage reference $V_{bg}$ (so, $V_{sby} \approx V_{bg}$).

According to a currently preferred embodiment of the present disclosure, the stand-by voltage $V_{sby}$ is obtained via a smaller replica (i.e., one with a lower power biasing) of the first current mirror 11.

Figure 4:
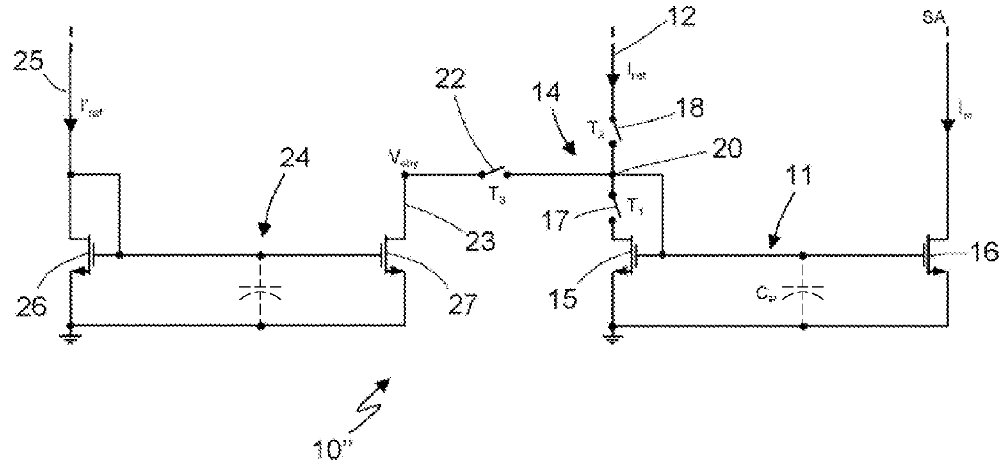
FIG. 4 shows a current mirror circuit according to a third embodiment of the present disclosure.

In detail, FIG. 4 (in which control unit 19 is not shown for sake of clarity), the current mirror circuit 10' includes a second current mirror 24 having a reference branch receiving a second reference current $I_{ref}'$ from a second reference current bus 25, and a mirrored branch connected to the reference voltage line 23 and providing the desired stand-by voltage $V_{sby}$.

In greater detail, the second current mirror 24 comprises a third mirror transistor 26 and a fourth mirror transistor 27 (in particular both NMOS transistors). The third mirror transistor 26 has a first conduction terminal (source terminal) connected to the reference potential, a second conduction terminal (drain terminal) connected to the second reference current bus 25 and receiving the second reference current $I_{ref}'$, and a control terminal directly connected to the second conduction terminal (the third mirror transistor 26 thus being diode-connected); and the fourth mirror transistor 27 having a first conduction terminal (source terminal) connected to the reference potential, a second conduction terminal (drain terminal) connected to the reference voltage line 23 (and thus to the intermediate node 20 via the third switch 22 of the switching stage 14), and a control terminal directly connected to the control terminal of the third mirror transistor 26. The stand-by voltage $V_{sby}$ is here generated by the current mirrored in the mirrored branch and flowing in the fourth mirror transistor 27.

In particular, to reduce a power consumption during stand-by, the second reference current $I_{ref}'$ is much lower than the first reference current $I_{ref}$ (e.g., ten times lower, for example 10 μA against 100 μA), possibly in the order of 1 μA, and the aspect ratio (W/L) of the third mirror transistor 26 is much lower than the aspect ratio of the first mirror transistor 15 (e.g., ten times lower, 10 μm/1 μm against 100 μm/1 μm). In general terms, if a current N·I (N being an integer value and I a generic current value) flows in the first mirror transistor 15 having an aspect ratio N·(W/L), then a current I can be forced to flow in the third mirror transistor 26 having an aspect ratio W/L, in order to generate the stand-by voltage $V_{sby}$.

Figure 5:
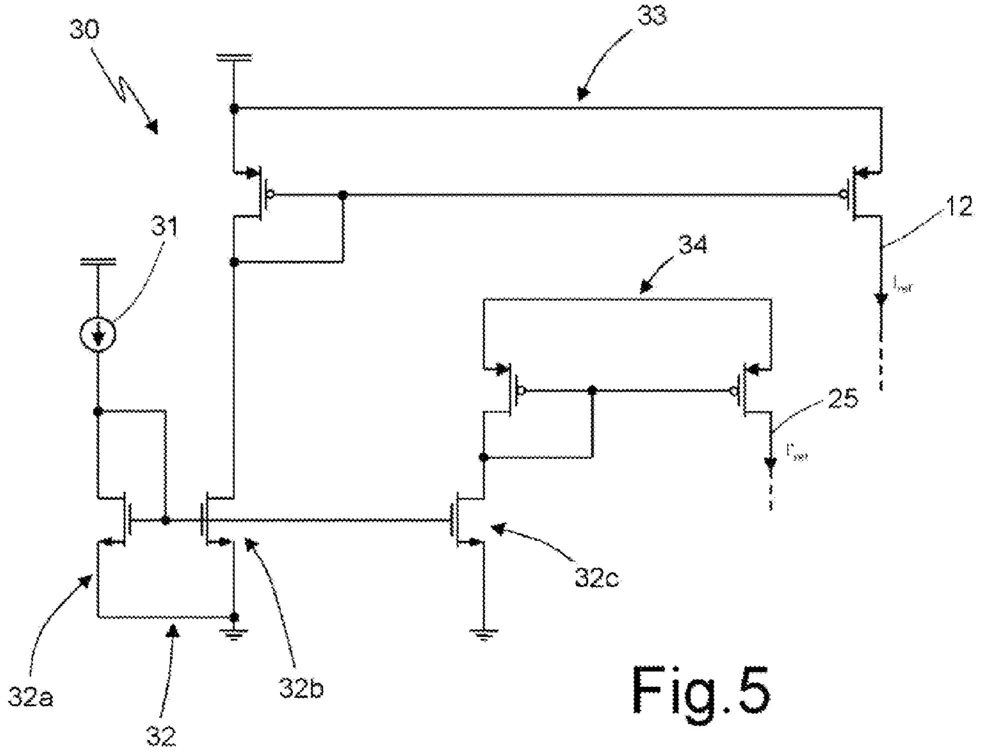
FIG. 5 shows a circuit for reference current generation in a non-volatile memory device incorporating the current mirror circuit.

FIG. 5 shows a reference current generating circuit, denoted with 30, arranged at the periphery of a die in which the current mirror circuit 10'' according to the disclosure (and the associated sense amplifier stage) may be made, and operable for generation of the first and second reference currents $I_{ref}$ and $I_{ref}'$, to be supplied to the same current mirror circuit, through respective reference current buses.

The reference current generating circuit 30 comprises: a constant current generator 31; a third current mirror 32 (here not described in detail, and formed by three NMOS transistors) having a reference branch 32*a* connected to the constant current generator 31, and a first and second mirrored branches 32*b*, 32*c*; a fourth current mirror 33 (formed by two PMOS transistors) having a respective reference branch connected to the first mirrored branch 32*b* of the third current mirror 32, and a respective mirrored branch supplying the first reference current $I_{ref}$ to the first reference current bus 12; and a fifth current mirror 34 (formed by two PMOS transistors) having a reference branch connected to the second mirrored branch 32*c* of the third current mirror 32, and a mirrored branch supplying the second reference current $I_{ref}'$ to the second reference current bus 25. In a known manner, the mirroring ratio of the third, fourth and fifth current mirrors 32, 33, 34 (and the aspect ratio of the corresponding MOS transistors) is designed so as to generate a desired value for the first and second reference currents $I_{ref}$, $I_{ref}'$ starting from the current generated by the constant current generator 31.

Figure 6:
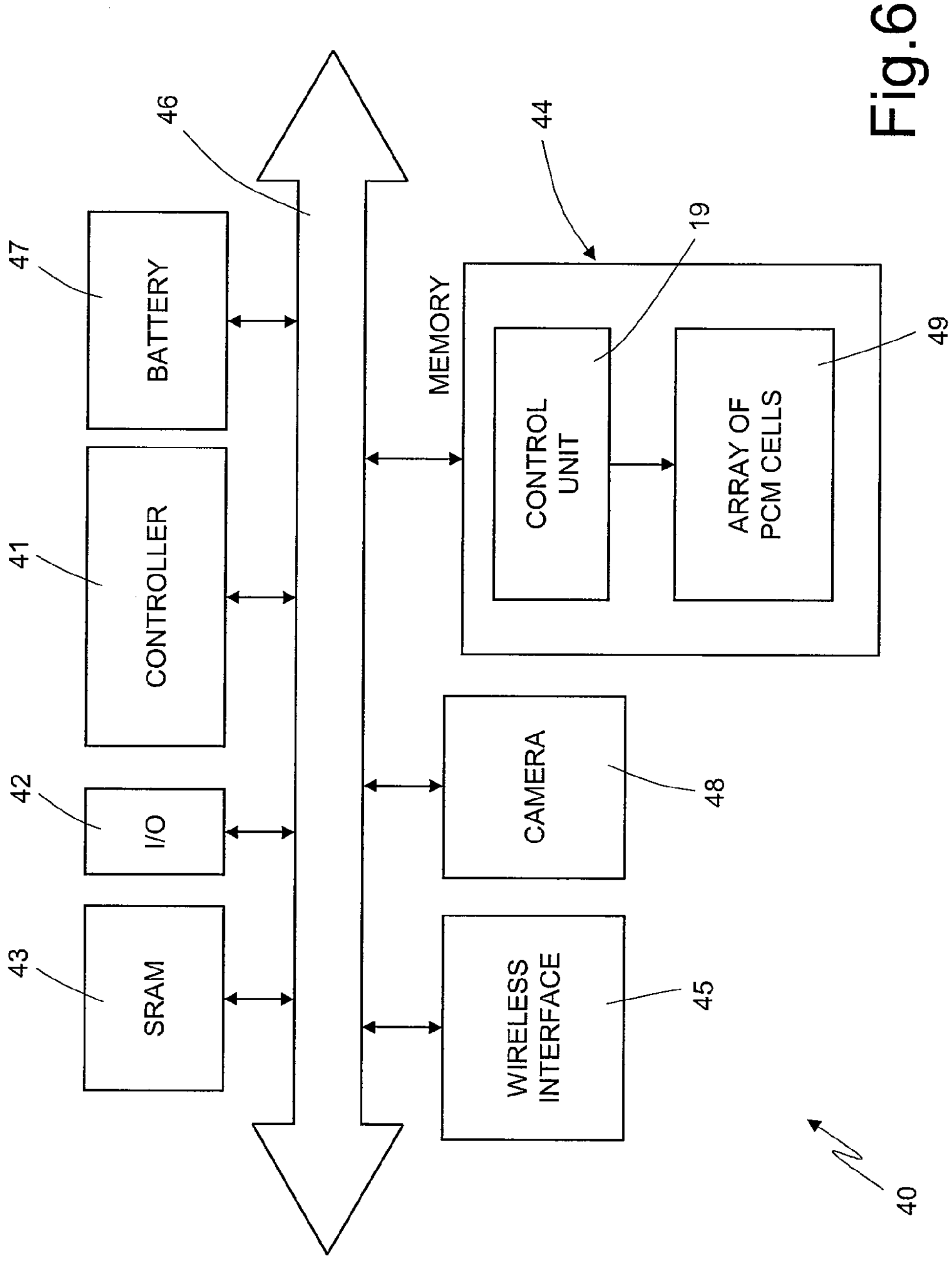
FIG. 6 shows a schematic block diagram of an electronic system in accordance with a further aspect of the present disclosure.

Turning now to FIG. 6, a portion of an electronic system 40 is described, in which the current mirror circuit 10, 10', 10'' can advantageously be embodied in accordance with a further aspect of the present disclosure. Electronic system 40 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. Electronic system 40 may be used in any of the following systems: a wireless local area network (WLAN) system, a wireless personal area network (WPAN) system, a cellular network, although the scope of the present disclosure is not limited in this respect.

Electronic system 40 includes a controller 41, an input/output (I/O) device 42 (e.g., a keypad, display), static random access memory (SRAM) 43, a memory 44, and a wireless interface 45 coupled to each other via a bus 46. A battery 47 and a camera 48 may be present in some embodiments. It should be noted that the scope of the present disclosure is not limited to embodiments having any or all of these components.

Controller 41 comprises, for example, one or more microprocessors, digital signal processors, microcontrollers, or the like.

Memory 44 may be used to store messages transmitted to or by the electronic system 40, and may also optionally be used to store instructions that are executed by controller 41 during operation, and to store user data. Memory 44 may be provided by one or more different types of non-volatile memory devices. In the illustrated embodiment, memory 44 comprises: an array 49 of PCM cells (as explained before, grouped in a plurality of memory partitions, each provided with one or more current mirror circuits 10, 10', 10'' and one or more sense amplifier stages SA); and a control unit 19, managing general operation of the memory 44, and in particular supplying to the current mirror circuits 10, 10', 10'' proper values of the control signal T1, T2, T3 depending on the current operating condition (active or stand-by). Memory 44 may comprise however other types of non volatile random access memories, such as a flash memory.

I/O device 42 may be used by a user to generate a message. Electronic system 40 uses wireless interface 45 to transmit and receive messages to and from a wireless communication network with a radio frequency (RF) signal. Examples of wireless interface 45 may include an antenna or a wireless transceiver, although the scope of the present disclosure is not limited in this respect.

The advantages of the present disclosure are clear from the above description.

In particular, the described current mirror circuit 10, 10', 10'' achieves both a reduction of power consumption and an efficient management of a stand-by (or not-active) condition.

Indeed, in the stand-by state, the control terminal of the first and second mirror transistors 15, 16 of the current mirror circuit 10, 10', 10'' is disconnected from the reference current $I_{ref}$ (so that the same reference current $I_{ref}$ does not cause power dissipation), and either left floating, or connected to a stand-by voltage. In any case, the voltage value of the same control terminal does not undergo substantial variation during the stand-by state, so that at reactivation from stand-by no appreciable delay is experienced in the generation of the mirrored current $I_m$. As explained, connecting the above control terminal to a stand-by voltage $V_{sby}$ having a proper value (via the third switch 22 of the switching stage 14) is particularly advantageous to manage stand-by periods having longer duration.

Finally, it is clear that numerous variations and modifications may be made to what described and illustrated herein, all falling within the scope of the disclosure.

In particular, in the described current mirror circuit 10, 10', 10", mirror transistors of a P-type could be used instead of mirror transistors of a N-type, with simple modifications.

Other circuital arrangements may be envisaged for generation of the stand-by voltage $V_{sby}$, different from the ones described. For example, other types of voltage reference generator could be used, different from the band-gap generator, to generate a stable voltage reference. Also, the stand-by voltage $V_{sby}$ may be generated locally at each memory partition, or at a die periphery and then routed to the memory partitions.

Current mirror circuit 10, 10', 10" may be used advantageously in different applications, in which an efficient management of a stand-by condition is to be provided.

Moreover, it is clear that, in case of a non-volatile memory application, the first and second reference current buses 12, 25 are common to the plurality of current mirror circuits 10, 10', 10" of the various memory partitions.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:

controlling a current mirror circuit having a first current mirror including first and second mirror transistors sharing a common control terminal, said first mirror transistor having a conduction terminal for receiving, during a first operating condition, a first reference current, and said second mirror transistor having a respective conduction terminal for providing, during said first operating condition, a mirrored current based on said first reference current, the controlling including:

connecting said control terminal to said conduction terminal of said first mirror transistor during said first operating condition, disconnecting said control terminal from said conduction terminal of said first mirror transistor during a second operating condition, different from said first operating condition; and connecting said control terminal to a reference voltage, during said second operating condition, by connecting said control terminal to a mirrored branch of a second current mirror having a reference branch for receiving a second reference current; said second reference current having a value that is smaller than a value of said first reference current.

2. The method according to claim 1, further comprising connecting said control terminal to a first reference current line during said first operating condition, and disconnecting said control terminal from said first reference current line during said second operating condition.

3. A non-volatile memory device, comprising:

a reference current generating circuit;

a sense amplifier stage; and a current mirror circuit operatively coupled to said reference current generating circuit and to said sense amplifier stage for performing memory operations, the current mirror circuit including:

a first current mirror including first and second mirror transistors sharing a common control terminal, said first mirror transistor having a conduction terminal for receiving, during a first operating condition, a first reference current, and said second mirror transistor having a conduction terminal for providing, during said first operating condition, a mirrored current based on said first reference current, a second current mirror having a reference branch configured to receive a second reference current and a mirrored branch configured to provide a reference voltage, and a switching stage configured to connect said control terminal to said conduction terminal of said first mirror transistor during said first operating condition, and to disconnect said control terminal from said conduction terminal of said first mirror transistor during a second operating condition, different from said first operating condition, the switching stage configured to connect said control terminal to the mirrored branch of the second current mirror, during said second operating condition.

4. The device according to claim 3, including PCM memory cells coupled to the sense amplifier stage.

5. The device according to claim 3, further comprising a control unit operable to supply control signals to said switching stage.

6. The device according to claim 3, wherein the current mirror circuit includes a first reference current line for providing said first reference current; wherein said switching stage is further configured to connect said control terminal to said first reference current line during said first operating condition, and to disconnect said control terminal from said first reference current line during said second operating condition.

7. A system, comprising:

a controller; and a non-volatile memory device coupled to the controller and including:

a reference current generating circuit;

a sense amplifier stage; and a current mirror circuit operatively coupled to said reference current generating circuit and to said sense amplifier stage for performing memory operations, the current mirror circuit including:

a first current mirror including first and second mirror transistors sharing a common control terminal, said first mirror transistor having a conduction terminal for receiving, during a first operating condition, a first reference current, and said second mirror transistor having a conduction terminal for providing, during said first operating condition, a mirrored current based on said first reference current, a second current mirror having a reference branch for receiving a second reference current and a mirrored branch providing a reference voltage, and a switching stage configured to connect said control terminal to said conduction terminal of said first mirror transistor during said first operating condition, and to disconnect said control terminal from said conduction terminal of said first mirror transistor during a second operating condition, different from said first operating condition, and to connect said control terminal to the mirrored branch of the second current mirror, during said second operating condition.

8. The system according to claim 7, wherein the current mirror circuit includes a first reference current line for providing said first reference current; wherein said switching stage is further configured to connect said control terminal to said first reference current line during said first operating condition, and to disconnect said control terminal from said first reference current line during said second operating condition.

9. A current mirror circuit, comprising:

a first current mirror including first and second mirror transistors sharing a common control terminal, said first mirror transistor having a conduction terminal for receiving, during a first operating condition, a first reference current, and said second mirror transistor having a conduction terminal for providing, during said first operating condition, a mirrored current based on said first reference current; and a switching stage configured to connect said control terminal to said conduction terminal of said first mirror transistor during said first operating condition, and to disconnect said control terminal from said conduction terminal of said first mirror transistor during a second operating condition, different from said first operating condition, and to connect said control terminal to a reference voltage, during said second operating condition, wherein said reference voltage is a band-gap reference voltage.

10. The current mirror circuit of claim 9 wherein the switching stage is operable to reduce delays due to a re-activation mode from a stand-by mode of the current mirror circuit.

11. A current mirror circuit, comprising:

a first current mirror including first and second mirror transistors sharing a common control terminal, said first mirror transistor having a conduction terminal for receiving, during a first operating condition, a first reference current, and said second mirror transistor having a conduction terminal for providing, during said first operating condition, a mirrored current based on said first reference current;

a switching stage configured to connect said control terminal to said conduction terminal of said first mirror transistor during said first operating condition, and to disconnect said control terminal from said conduction terminal of said first mirror transistor during a second operating condition, different from said first operating condition, and the switching stage configured to connect said control terminal to a reference voltage, during said second operating condition; and a second current mirror having a reference branch configured to receive a second reference current and a mirrored branch configured to provide said reference voltage, said second reference current having a value that is smaller than a value of said first reference current.

12. The current mirror circuit of claim 11 wherein the current mirror circuit is one of a plurality of current mirror circuits configured to perform reading or verification operations of a memory during said first operating condition.

13. The circuit according to claim 11, wherein said second current mirror includes third and fourth mirror transistors sharing a common control terminal, wherein the reference branch of the second current mirror includes the third mirror transistor and the mirrored branch of the second current mirror includes the fourth mirror transistor, said third transistor being diode-connected, said first and third mirror transistors being MOS transistors, and said third transistor having an aspect ratio that is lower than an aspect ratio of said first transistor.

14. A current mirror circuit, comprising:

a first current mirror including first and second mirror transistors sharing a common control terminal, said first mirror transistor having a conduction terminal for receiving, during a first operating condition, a first reference current, and said second mirror transistor having a conduction terminal for providing, during said first operating condition, a mirrored current based on said first reference current; and a switching stage configured to connect said control terminal to said conduction terminal of said first mirror transistor during said first operating condition, and to disconnect said control terminal from said conduction terminal of said first mirror transistor during a second operating condition, different from said first operating condition, and the switching stage configured to connect said control terminal to a reference voltage, during said second operating condition, wherein a voltage at said control terminal has a given value during said first operating condition, and said reference voltage is substantially equal to said given value.

15. The current mirror circuit of claim 14, further including a second current mirror having third and fourth mirror transistors, the third transistor having a width divided by length aspect ratio that is less than one-tenth of a width divided by length aspect ratio of the first transistor, the fourth transistor being configured to provide the reference voltage.

16. The circuit according to claim 14, wherein said given value is substantially equal to the sum of a threshold voltage and an overdrive voltage of said first mirror transistor.

* * * * *